(12) United States Patent
Dasgupta

(10) Patent No.: US 7,646,247 B2
(45) Date of Patent: Jan. 12, 2010

(54) AHUJA COMPENSATION CIRCUIT FOR OPERATIONAL AMPLIFIER

(75) Inventor: Uday Dasgupta, Singapore (SG)

(73) Assignee: MediaTek Singapore Pte Ltd., Singapore (SG)

( * ) Notice: Subject to any disclaimer, the term of this patent is extended or adjusted under 35 U.S.C. 154(b) by 37 days.

(21) Appl. No.: 12/131,902

(22) Filed: Jun. 2, 2008

(65) Prior Publication Data

US 2009/0295477 A1 Dec. 3, 2009

(51) Int. Cl.
*H03F 1/14* (2006.01)
(52) U.S. Cl. .......................................... 330/292; 330/76
(58) Field of Classification Search .......... 330/252–261, 330/292, 76, 282, 310
See application file for complete search history.

(56) References Cited

U.S. PATENT DOCUMENTS 6,977,490 B1 * 12/2005 Zhang et al. ................. 323/280
7,049,894 B1 * 5/2006 Aram .......................... 330/296
7,248,117 B1 * 7/2007 Li et al. ...................... 330/260

OTHER PUBLICATIONS

[Richard J. Reay, Gregory T. A. Kovacs], ["An Unconditionally Stable Two-Stage CMOS Amplifier"], [May 1995], [pp. 591-594], [vol. 30, No. 5], [IEEE Journal of Solid-State Circuits].

[Bhupendra K. Ahuja], ["An Improved Frequency Compensation Technique for CMOS Operational Amplifiers"],[Dec. 1983], [pp. 629-633], [vol. SC-18, No. 6], [IEEE Journal of Solid-State Circuits].

[Uday Dasgupta, Yong Ping Xu], ["Effects of Resistive Loading on Unity Gain Frequency of Two-Stage CMOS Operational Amplifiers"], [2003], [pp. I-361-I-364], [0-7803-7761-3/03], [IEEE], [Singapore].

* cited by examiner

*Primary Examiner*—Robert Pascal
*Assistant Examiner*—Hieu P Nguyen
(74) *Attorney, Agent, or Firm*—Winston Hsu

(57) ABSTRACT

A frequency compensated operational amplifier includes: an input stage, for receiving an input signal; an output stage, coupled to the input stage, for generating an output signal according to an output of the input stage; a first current source, for providing a first bias current; a second current source, for providing a second bias current identical to the first bias current; an Ahuja compensation circuit, comprising: a matched transistor pair, coupled to the first current source and the second current source; a capacitor coupled between the matched transistor pair and the output stage; and a transconductance boosting circuit, coupled to the matched transistor pair, for boosting transconductance of the matched transistor pair.

7 Claims, 5 Drawing Sheets

Miller Compensation

Ahuja Compensation

AHUJA COMPENSATION CIRCUIT FOR OPERATIONAL AMPLIFIER

BACKGROUND OF THE INVENTION

1. Field of the Invention

The present invention relates to an Ahuja compensation scheme, and in particular, an Ahuja compensated operational amplifier that eliminates the bias problem inherent in previous implementations.

2. Description of the Prior Art

The Ahuja frequency compensation scheme is a well-known frequency compensation for operational amplifiers. The Ahuja frequency compensation was developed to improve upon the well-known Miller compensation, which consists of coupling a capacitor across an output stage of an operational amplifier. The Ahuja frequency compensation implements an indirect coupling of this capacitor, by providing a third stage consisting of a compensating transistor coupled to the capacitor.

For a clearer representation of the Miller compensation and Ahuja compensation, please refer to FIG. 1. FIG. 1 is a diagram representing a Miller compensation scheme 100 and an Ahuja compensation scheme 200. As can be seen from the diagram, the Ahuja compensation scheme 200 implements a compensating transistor $g_{m3}$ coupled to the capacitor $C_C$ and to a bias voltage $V_{BIAS}$. The transistor itself is supplied with a bias current $I_{BIAS}$. The benefits of the Ahuja compensation over the Miller compensation are a better ability to cope with high resistive and capacitive loading, reduced size of the capacitor $C_C$, and better PSRR (power supply rejection ratio).

Please refer to FIG. 2. FIG. 2 shows the Ahuja compensation 200 in FIG. 1 implemented in a related art two stage operational amplifier 300. The operational amplifier 300 comprises an input stage coupled to a differential current source, the input stage comprising transistors MP5, MP1$a$, MP1$b$, MN1$a$ and MN1$b$. The input stage is coupled to an output stage comprising transistors MP2 and MN2, and coupled between a supply voltage $V_{DD}$ and ground. The compensating transistor MP3 is coupled to bias voltage $V_{BP2}$ and compensating capacitor $C_C$. MP3 is further coupled to MP4 which is coupled between $V_{DD}$ and bias voltage $V_{BP1}$ for supplying MP3 with the bias current $I_{BIAS}$. The circuit further comprises transistors MN3 and MN4, which are coupled to MP3, MN2, MN1$b$, and respectively coupled to bias voltages $V_{BN1}$ and $V_{BN2}$. The purpose of MN3 and MN4 is to provide a path for the current $I_{BIAS}$ in MP3 and MP4 to ground.

The disadvantage of this circuit is that MN3 and MN4 must be biased using VBN1 and VBN2 to carry exactly the current $I_{BIAS}$ in MP3 and MP4 biased separately using VBP2 and VBP1. Since it is not practically possible to bias a p-channel transistor and an n-channel transistor separately to carry exactly the same current, this objective is never met. The consequence of this is that the DC offset voltage of the operational amplifier is high.

Furthermore, the Ahuja compensation scheme 200 illustrated in FIG. 1 does not achieve the desired benefits under certain conditions such as light capacitive loading. Therefore, both the original Ahuja compensation 200 and the Ahuja compensated operational amplifier 300 need to be improved.

SUMMARY OF THE INVENTION

With this in mind, the present invention aims to provide an updated Ahuja compensation scheme that has good compensation under a variety of conditions, and an implementation of this updated scheme in an operational amplifier that does not have the bias problem inherent in previous implementations.

A first embodiment of a frequency compensated operational amplifier comprises: an input stage, for receiving an input signal; an output stage, coupled to the input stage, for generating an output signal according to an output of the input stage; a first current source, for providing a first bias current; a second current source, for providing a second bias current identical to the first bias current; an Ahuja compensation circuit, comprising: a matched transistor pair, coupled to the first current source and the second current source; a capacitor coupled between the matched transistor pair and the output stage; and a transconductance boosting circuit, coupled to the matched transistor pair, for boosting transconductance of the matched transistor pair. The matched transistor pair comprises: a first transistor, having a control node coupled to a first bias voltage, a first node coupled to the first current source, and a second node; and a second transistor, having a control node coupled to the first bias voltage, a first node coupled to the second current source, and a second node, wherein the second nodes of the first and second transistors are coupled across the input stage. The transconductance boosting circuit comprises: a first amplifier, having an output node coupled to the control node of the first transistor, a first input node coupled to the first node of the first transistor, and a second input node coupled to a second bias voltage; and a second amplifier, having an output node coupled to the control node of the second transistor, a first input node coupled to the first node of the second transistor, and a second input node coupled to the second bias voltage.

In a second embodiment of the present invention, the first current source and second current source provide a first current and a second current, respectively. The operational amplifier further comprises a current mirror coupled between the input stage and the output stage, and the matched transistor pair comprises: a first transistor, having a control node coupled to a first bias voltage, a first node coupled to a first bias current, and a second node; and a second transistor, having a control node coupled to the first bias voltage, a first node coupled to a second bias current, and a second node, wherein the second nodes of the first and second transistors are coupled to the current mirror. The transconductance boosting circuit comprises: a first amplifier, having an output node coupled to the control node of the first transistor, a first input node coupled between the first node of the first transistor and the first current source, and a second input node coupled to a second bias voltage; and a second amplifier, having an output node coupled to the control node of the second transistor, a first input node coupled between the first node of the second transistor and the second current source, and a second input node coupled to the second bias voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
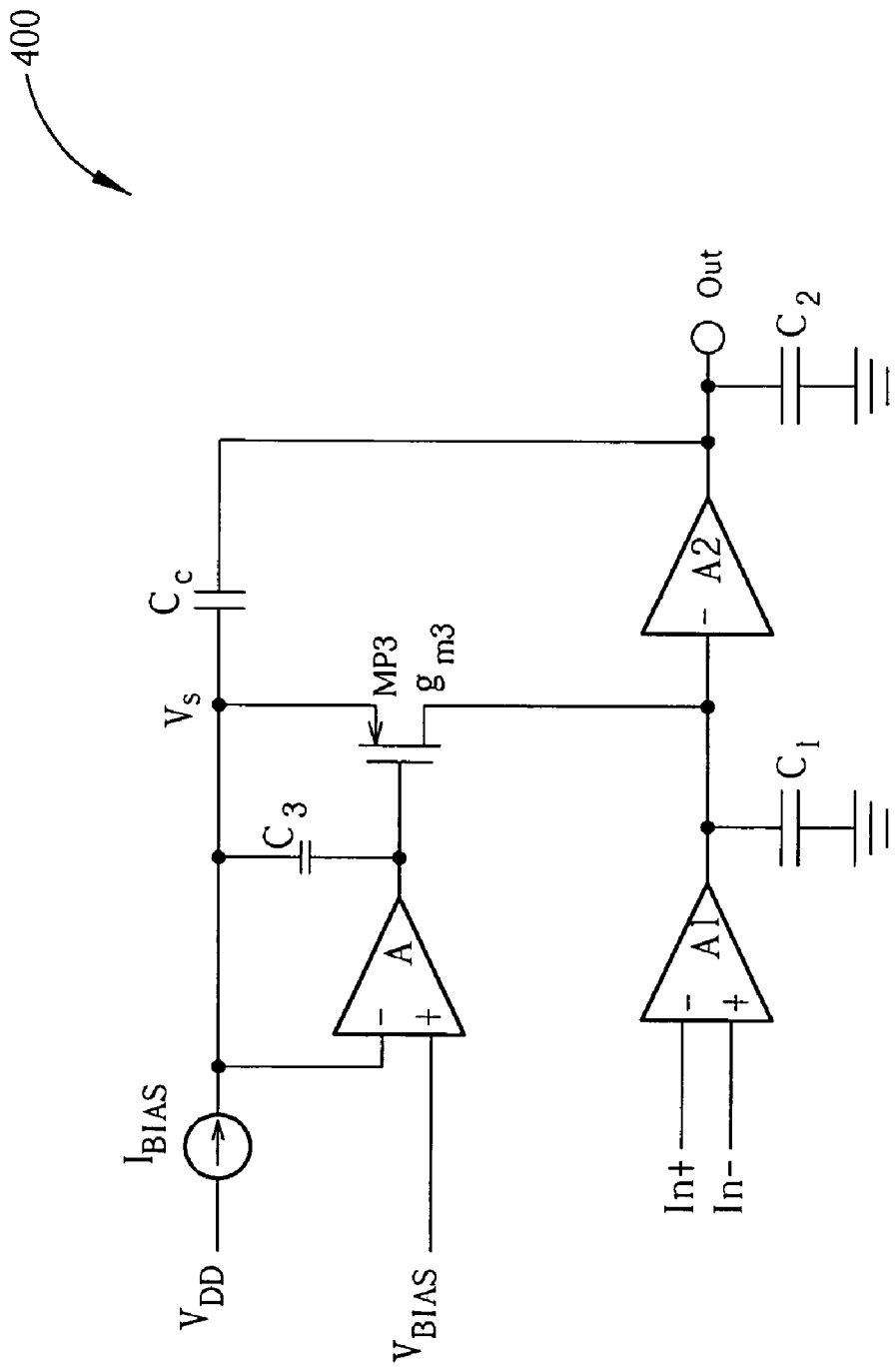
FIG. 3 is a diagram of an updated Ahuja compensation scheme according to the present invention.

Please refer to FIG. 3. FIG. 3 is a diagram of an improved Ahuja compensation scheme 400. This scheme aims to improve the compensation offered by the original Ahuja compensation 200, by indirectly multiplying the transconductance of the compensating transistor MP3. The effect of this indirect multiplying is to move the non-dominant poles and zeros to higher frequencies and to increase damping for the non-dominant poles.

The improved scheme shown in FIG. 3 provides an amplifier A having a first input coupled to the bias current $I_{BIAS}$, a second input coupled to the bias voltage $V_{BIAS}$, and an output coupled to the gate of the compensating transistor MP3. The source voltage is therefore amplified, and this amplified voltage is then applied to the gate of the compensating transistor MP3. If the amplifier A has a gain of $-A$ and the source voltage is $v_s$, then the gate-source voltage vgs is equal to $-(1+A) v_s$. The gate-source voltage has therefore been multiplied by a factor of $(1+A)$. As long as the gain of the amplifier A is large enough, the source voltage of the compensating transistor MP3 will remain at $V_{BIAS}$. As the drain current of the compensating transistor MP3 is a factor of the transconductance and the gate-source voltage, and the source voltage remains at $V_{BIAS}$, the presence of the amplifier A effectively increases the transconductance by a factor of $(1+A)$. The gate-source capacitance $C_3$ of the compensating transistor MP3 is also increased by the same factor. Now, transconductance depends on the size of a device and on the bias current. Therefore, the present invention utilizes an indirect method of increasing the transconductance of the compensating transistor MP3 without having to change its size or bias current. This saves power consumption and, to some extent, silicon area.

Figure 2:
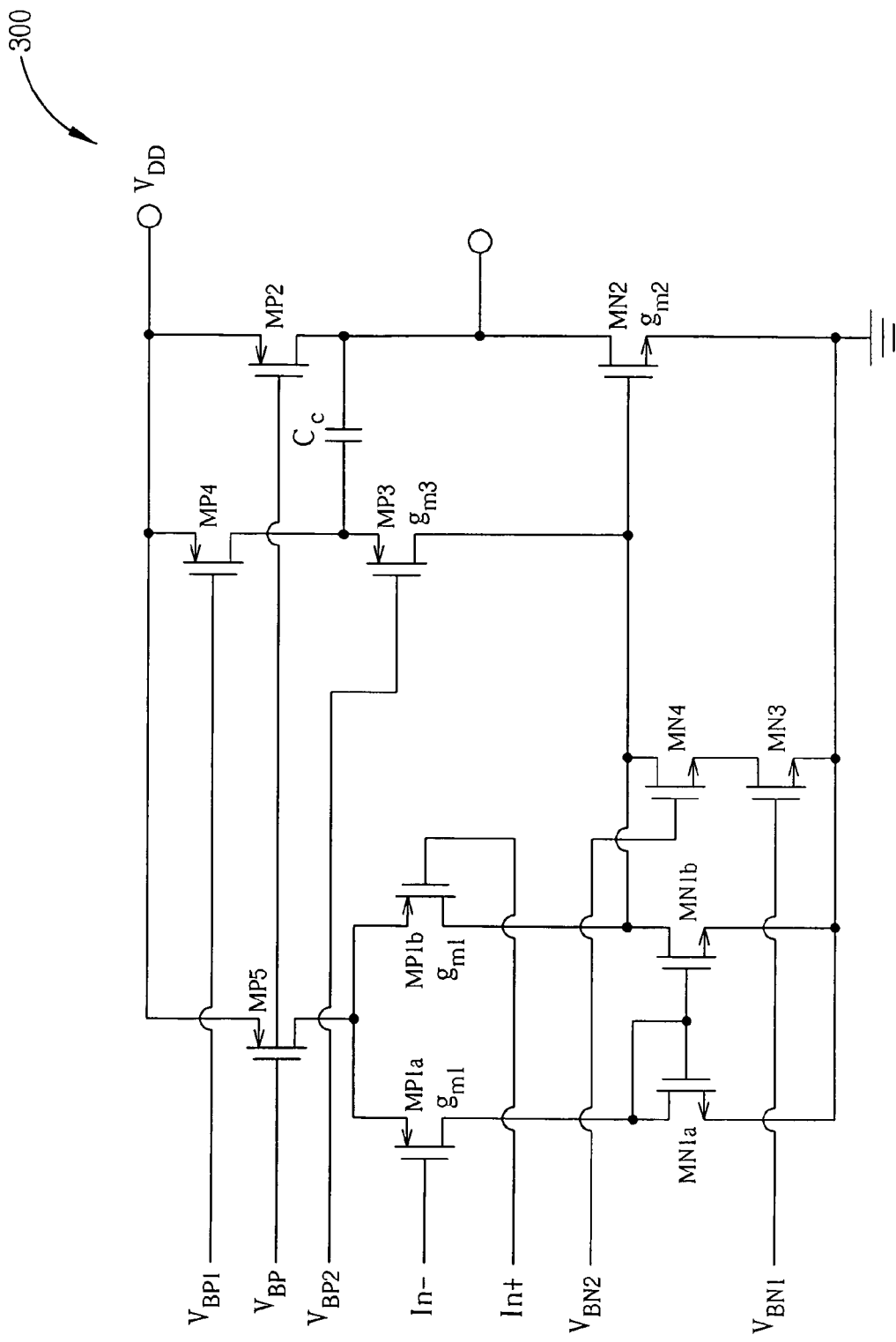
FIG. 2 is a diagram of an Ahuja compensation implemented in a two stage operational amplifier.

The effect of this increase in transconductance of circuit 400 in FIG. 3 will be shown below with reference to the circuit 300 shown in FIG. 2. The transfer function for the circuit 300 shown in FIG. 2 is written as:

$$A(s) = A_0 \frac{\left[\frac{s}{S_z} + 1\right]}{\left[\frac{s}{S_{p1}} + 1\right]\left[\frac{s^2}{\omega_n^2} + \frac{s}{\left[\frac{\omega_n}{2\xi}\right]} + 1\right]} \quad (1)$$

$A_0$=DC gain of the operational amplifier=$g_{m1}g_{m2}r_1r_2$ $$S_{p1} = \text{dominant pole} = -\frac{g_{m1}}{A_0 C_C}$$

$$S_z = \text{non-dominant zero} = -\frac{g_{m3}}{C_C}$$

$$\omega_0 = \text{unity gain bandwidth of the operational amplifier} = \frac{g_{m1}}{C_C}$$

$$\omega_n = \sqrt{\frac{g_{m2}g_{m3}}{\rho C_1 C_2}}$$

$$\xi = \frac{1}{2}\sqrt{\frac{C_1 g_{m3}}{\rho C_2 g_{m2}}}\left[1 + \frac{C_2}{C_C}\right]$$

$$\rho = 1 + \frac{C_3}{C_{eq}}$$

$$\frac{1}{C_{eq}} = \frac{1}{C_2} + \frac{1}{C_C}$$

where $\xi$ and $\omega_n$ are the standard $2^{nd}$ order parameters associated with non-dominant poles $S_{p2}$ and $S_{p3}$.

The circuit in FIG. 2 has three poles of which $S_{p1}$ is the dominant pole and $S_{p2}$, $S_{p3}$ are the non-dominant poles. For Miller compensation the non-dominant poles are always real, but for the Ahuja compensation they can be real or complex. This depends on the $2^{nd}$ order parameter $\xi$. If it is greater or equal to 1 then this corresponds to a damped frequency response and therefore the non-dominant poles are real; if it is less than 1 then the non-dominant poles are complex, meaning there is an under-damped frequency response.

To achieve good compensation, the non-dominant poles and non-dominant zeros need to be as far away as possible from the unity gain bandwidth ($\omega_0$). The frequency response also needs to be as damped as possible. Effectively, the magnitudes of $s_z$ and $\omega_n$ need to be as high as possible, the frequency response of $S_{p2}$ and $S_{p3}$ needs to be as damped as possible, so $\xi$ needs to be as high as possible (at least greater than 1) to ensure there is sufficient frequency damping.

Figure 1:
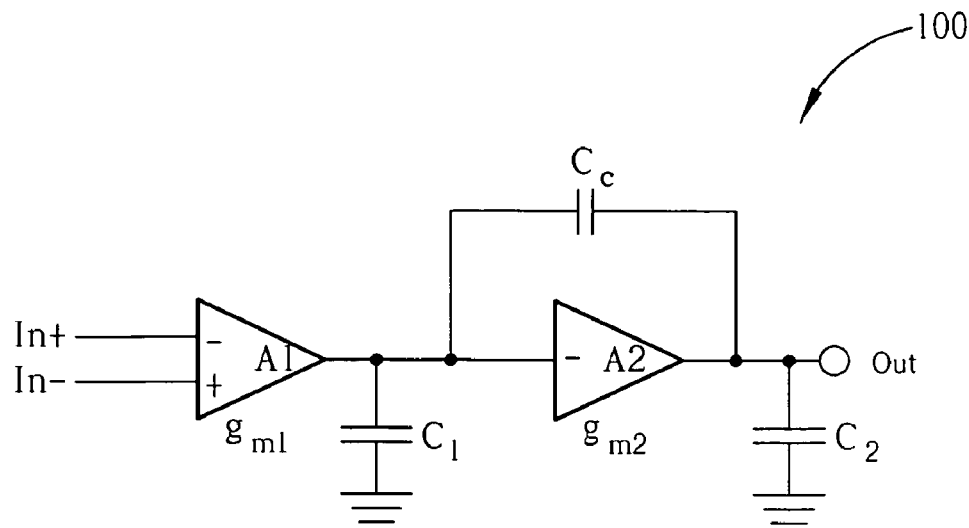
FIG. 1 is a diagram of Miller compensation and Ahuja compensation schemes according to the related art.
Figure 1:
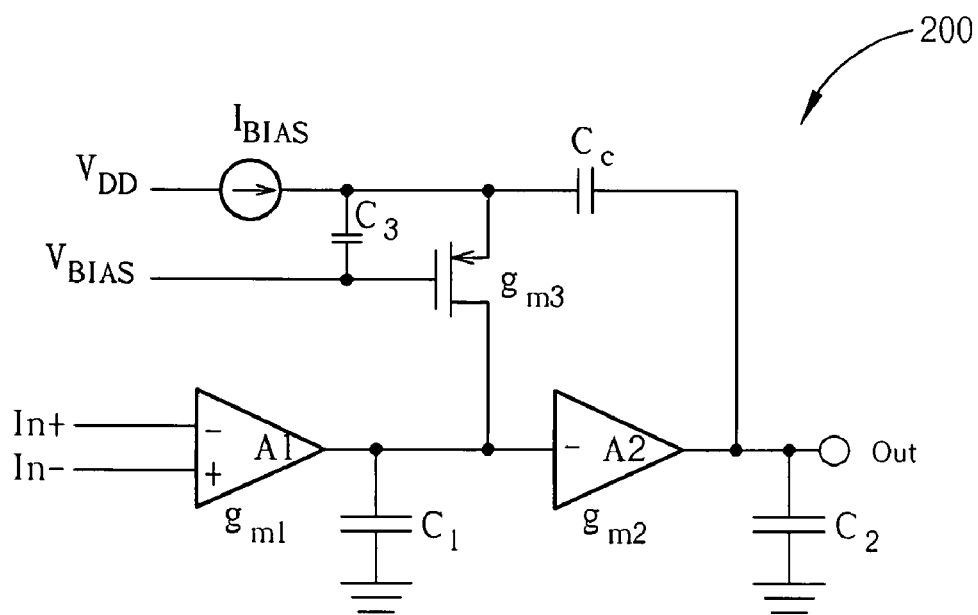

As the capacitance $C_3$ and transconductance $g_{m3}$ (and therefore $\rho$) have been shown to increase by a factor of $(1+A)$ as demonstrated in the above, $s_z$ will increase by a factor of $1+A$, and $\xi$ and $\omega_n$ will increase by a factor of $$\sqrt{1 + C_{eq}/C_3}$$

as long as $1+A \gg C_{eq}/C_3$. Therefore, the improved Ahuja compensation scheme 400 shown in FIG. 3 improves over the related art of scheme 200 in FIG. 1 by providing increased compensation.

Figure 4:
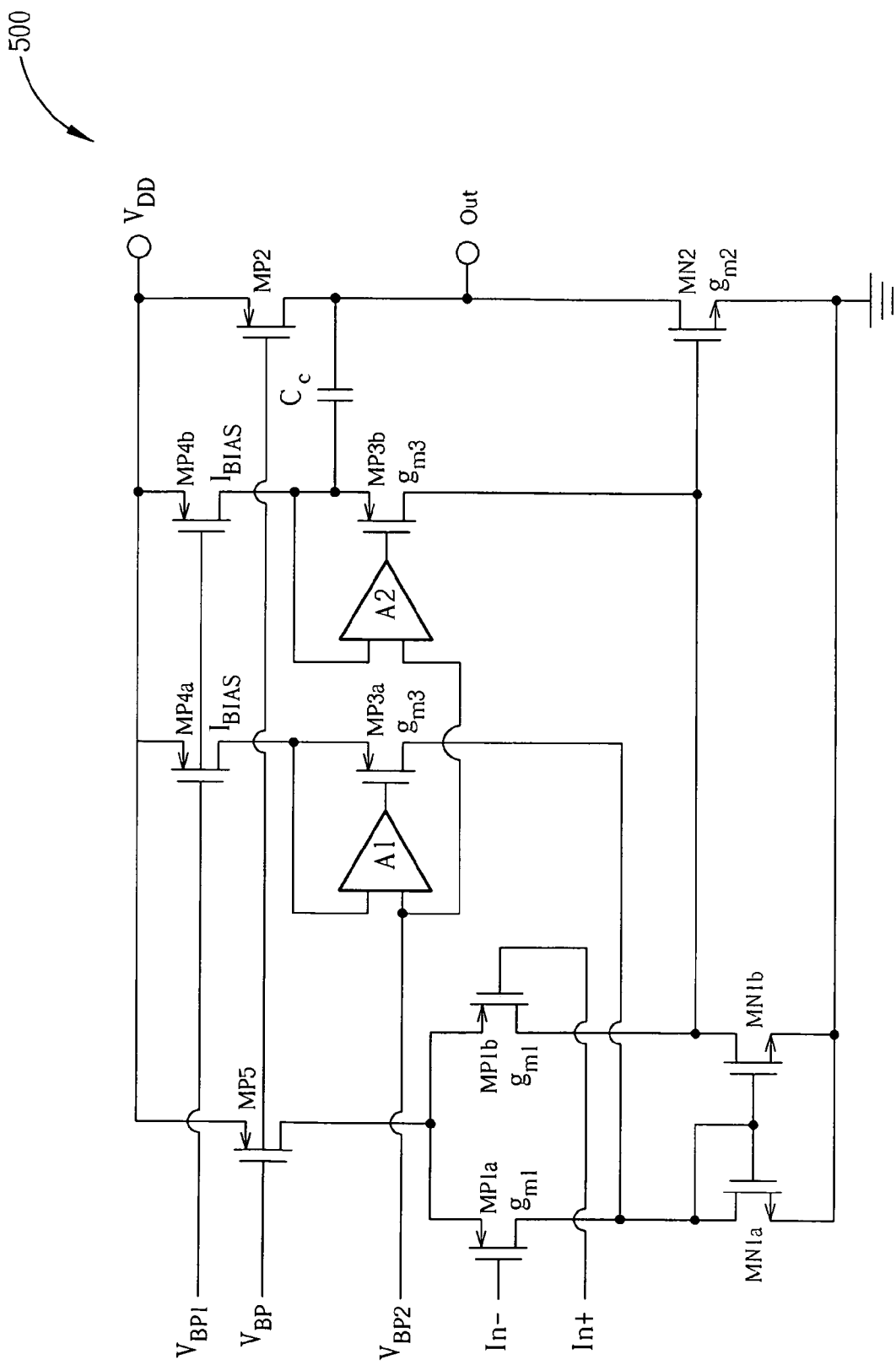
FIG. 4 is a diagram of the updated Ahuja compensation scheme of FIG. 3 implemented in an operational amplifier that solves the bias problem of FIG. 2 according to a first embodiment of the present invention.

Please refer to FIG. 4. FIG. 4 is a diagram of an operational amplifier 500 that solves the bias problem of the circuit 300 in FIG. 2 and implements the improved Ahuja compensation scheme 400 of FIG. 3. The circuit 500 in FIG. 4 is similar to the circuit 300 in FIG. 2 but with some important differences. The single transistor MP4 has been replaced with a pair of P transistors MP4a and MP4b, that are both coupled to the bias voltage $V_{BP1}$ and the supply voltage $V_{DD}$. Therefore they both supply a bias current $I_{BIAS}$. Furthermore, the single compensating transistor MP3 has been replaced by a pair of compensating transistors, MP3b and MP3a. It can be seen that it is now possible to make MP4a, MP3a and MP4b, MP3b to carry identical currents IBIAS since they are all p-channel devices and biased from common or matching bias nodes. Thus, this amendment ensures that the bias problem does not exist, as MP3a is coupled between MP1a and MN1a, and MP3b is coupled between MP1b and MN1b. The circuit 500 in FIG. 4 further shows the Ahuja compensation scheme consisting of a first amplifier $A_1$ and a second amplifier $A_2$. The use of two amplifiers in this embodiment is for matching or balance, as the circuit 500 comprises two compensating transistors (MP3a and MP3b).

The effect of the improved Ahuja compensation scheme in this circuit 500 is as described above—by indirectly increasing the transconductance of the compensating transistors MP3a and MP3b, the non-dominant poles and zeros are moved to be as far as possible from $w_0$ and therefore the compensation is improved. Removing the offset problem of the related art allows this improved scheme to be practically implemented in the circuit 500 to obtain these desired results.

Figure 5:
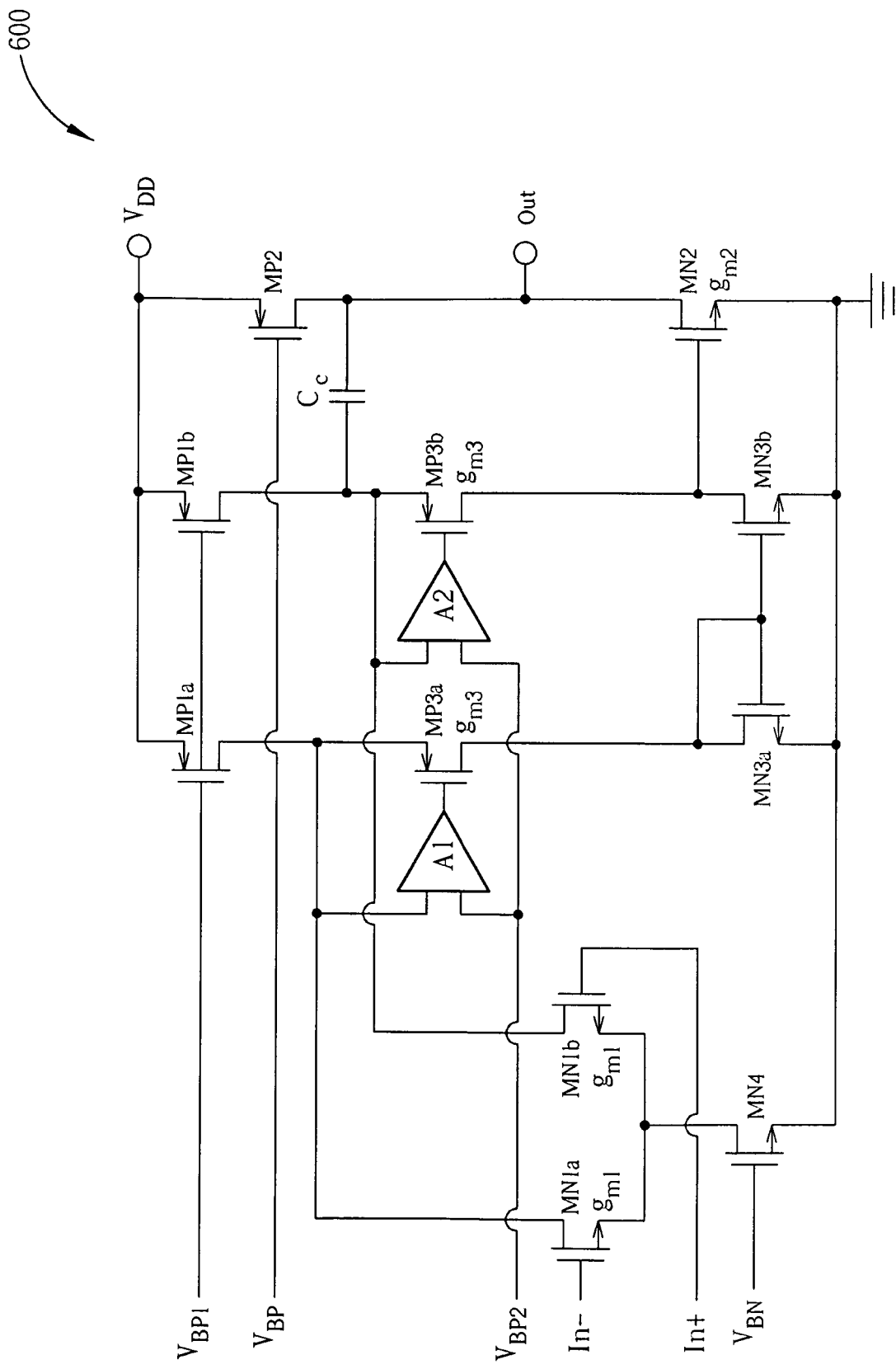
FIG. 5 is a diagram of the updated Ahuja compensation scheme of FIG. 3 implemented in an operational amplifier according to a second embodiment of the present invention.

Please refer to FIG. 5. FIG. 5 is another implementation of the improved Ahuja compensation scheme in a circuit 600 that does not have the bias problem inherent in the circuit 300 shown in FIG. 2. As will be seen from the diagram, the improved Ahuja compensation scheme of the present invention also has the effect of increasing transconductance and having improved compensation. The circuit 600 shown in FIG. 5 is an operational amplifier consisting of an input stage comprising the transistor MN4 and the differential pair MN1a and MN1b, and further comprising a pair of P transistors MP1a, MP1b coupled to bias voltage $V_{BP1}$ and respectively coupled to a pair of compensating transistors MP3a, MP3b, which are in turn coupled to a current mirror formed by transistors MN3a, MN3b, and also coupled across the differential pair. The amplifiers $A_1$, $A_2$, respectively coupled to the compensating transistors MP3a, MP3b, have a first input coupled to a bias voltage $V_{BP2}$ and a second input respectively coupled to the source of transistors MP3a, MP3b, and also coupled to the differential pair MN1a, MN1b. Again, the improved Ahuja compensation scheme enhances compensation by indirectly increasing the transconductance of the compensating transistors MP3a, MP3b through amplifying the gate-source voltage.

The present invention therefore provides an improved Ahuja compensation scheme that increases the transconductance of the compensating transistor though the addition of an amplifier, thereby ensuring good compensation, and further provides an implementation of the improved Ahuja compensation in an operational amplifier that solves the bias problem associated with a conventional operational amplifier that implements Ahuja compensation. Furthermore, the improved Ahuja compensation can be implemented in other conventional operational amplifier circuits while still having the effect of improved compensation through indirect increase of the transconductance of the compensating transistor.

The benefits of the improved Ahuja compensation over the related art are increased power efficiency, increased area efficiency, better PSRR, and better ability to cope with light capacitive loading.

Those skilled in the art will readily observe that numerous modifications and alterations of the device and method may be made while retaining the teachings of the invention.

What is claimed is:

1. A frequency compensated operational amplifier comprising:
    an input stage, for receiving an input signal;
    an output stage, coupled to the input stage, for generating an output signal according to an output of the input stage;
    a first current source, for providing a first bias current;
    a second current source, for providing a second bias current identical to the first bias current;
    an Ahuja compensation circuit, comprising:
        a matched transistor pair, coupled to the first current source and the second current source;
        a capacitor coupled between the matched transistor pair and the output stage; and
        a transconductance boosting circuit, coupled to the matched transistor pair, for boosting transconductance of the matched transistor pair.

2. The frequency compensated operational amplifier of claim 1, wherein the matched transistor pair comprises:
    a first transistor, having a control node coupled to a first bias voltage, a first node coupled to the first current source, and a second node; and
    a second transistor, having a control node coupled to the first bias voltage, a first node coupled to the second current source, and a second node, wherein the second nodes of the first and second transistors are coupled across the input stage.

3. The frequency compensated operational amplifier of claim 2, wherein the transconductance boosting circuit comprises:
    a first amplifier, having an output node coupled to the control node of the first transistor, a first input node coupled to the first node of the first transistor, and a second input node coupled to a second bias voltage; and
    a second amplifier, having an output node coupled to the control node of the second transistor, a first input node coupled to the first node of the second transistor, and a second input node coupled to the second bias voltage.

4. The frequency compensated circuit of claim 3, wherein the first current source is implemented using a PMOS transistor having a control node coupled to a third bias voltage, a first node coupled to a supply voltage, and a second node coupled to the first input node of the first amplifier; and the second current source is implemented using a PMOS transistor having a control node coupled to the third bias voltage, a first node coupled to the supply voltage, and a second node coupled to the first input node of the second amplifier.

5. A frequency compensated operational amplifier comprising:
    an input stage, for receiving an input signal;
    an output stage, coupled to the input stage, for generating an output signal according to an output of the input stage;
    a first current source, for providing a first current;
    a second current source, for providing a second current;
    an Ahuja compensation circuit, comprising:
        a matched transistor pair, coupled to the first current source and the second current source;
        a capacitor coupled between the matched transistor pair and the output stage; and
        a transconductance boosting circuit, coupled to the matched transistor pair, for boosting transconductance of the matched transistor pair.

6. The frequency compensated operational amplifier of claim 5, further comprising a current mirror coupled between the input stage and the output stage, wherein the matched transistor pair comprises:
    a first transistor, having a control node coupled to a first bias voltage, a first node coupled to a first bias current, and a second node; and
    a second transistor, having a control node coupled to the first bias voltage, a first node coupled to a second bias current, and a second node, wherein the second nodes of the first and second transistors are coupled to the current mirror.

7. The frequency compensated operational amplifier of claim 6, wherein the transconductance boosting circuit comprises:
a first amplifier, having an output node coupled to the control node of the first transistor, a first input node coupled between the first node of the first transistor and the first current source, and a second input node coupled to a second bias voltage; and
a second amplifier, having an output node coupled to the control node of the second transistor, a first input node coupled between the first node of the second transistor and the second current source, and a second input node coupled to the second bias voltage.

* * * * *